THIN FILMS OF METAL POLYPHTHALOCYANINES ON SUBSTRATES AND COATING PROCESS

Filed Dec. 31, 1962

INVENTOR
BERNARD S. WILDI
BY Lloyd B. Stevens, Jr.
ATTORNEY

United States Patent Office 3,293,075
Patented Dec. 20, 1966

3,293,075

THIN FILMS OF METAL POLYPHTHALOCYANINES ON SUBSTRATES AND COATING PROCESS

Bernard S. Wildi, St. Louis, Mo., assignor to Monsanto Company, a corporation of Delaware Filed Dec. 31, 1962, Ser. No. 248,804
11 Claims. (Cl. 117—211)

The invention relates to articles of manufacture which are thin films of metal polyphthalocyanines on substrates or supports and to a process for producing these articles.

Metal polyphthalocyanines are known in the art, e.g. French Patent No. 1,207,348, describes the making of metal polyphthalocyanines. This French patent is based on a copending United States application, Serial No. 696,027, filed November 13, 1957, and now Patent No. 3,245,965. These metal polyphthalocyanines are useful as organic semiconductors. Now a method has been found for making articles which are thin films of metal polyphthalocyanines on substrates, thus providing metal polyphthalocyanines in a form not previously available and a very superior form for some semi-conductive and related uses.

It is an object of the invention to provide new articles of manufacture which are thin films of metal polyphthalocyanines on substrates.

It is another object of the invention to provide a process for making articles of manufacture which are thin films of metal polyphthalocyanines on substrates.

These and other objects of the invention will become apparent as the detailed description of the invention proceeds.

The articles of the invention can be thin films of metal polyphthalocyanine on either inert (electrical insulator) or conductive (including metals, metal alloys and metal-containing semiconductors) substrates; however, if the substrate or support for the thin film of metal polyphthalocyanine is inert it must have a metal-containing conductive surface of a material described above so the metal polyphthalocyanine can be formed thereon from pyromellitonitrile or a mixture of pyromellitonitrile and phthalonitrile.

In order to obtain thin films of substantially uniform thickness of metal polyphthalocyanine, it is preferred to form the metal polyphthalocyanine on substrates with highly-polished or smooth plane conductive surfaces; however, if uniformity of film is not critical, porous or even uneven surfaces can be used. Methods of polishing metals, alloys and semi-conductor surfaces are well known in the art. Conductive surfaces on inert substrates can be provided by vapor deposition at high temperatures under high vacuum of a metal, a metal alloy or semiconductive material or volatile compounds thereof, by methods well known in the art. Especially desirable conductive surfaces on which to form metal polyphthalocyanines are epitaxial film surfaces or semiconductor substrates therefor such as those described in copending application Serial No. 209,740, filed July 13, 1962 and now Patent No. 3,218,205. The thin films are formed on the conductive surface by contacting the conductive surface with pyromellitonitrile at elevated temperatures for a time sufficient to form the desired thickness of metal polyphthalocyanine. The thin film can be formed by subliming pyromellitonitrile onto a hot conductive surface, or the pyromellitonitrile dissolved in an inert solvent can be contacted with the conductive surface.

As has been stated above, either pyromellitonitrile or a mixture of pyromellitonitrile and phthalonitrile can be used in preparing the thin films of metal polyphthalocyanines of the invention; however, to assure the preparation of a substantial amount of the polymeric metal phthalocyanines, it is necessary that the pyromellitonitrile comprise at least about 50 mole percent of the mixture when a mixture of pyromellitonitrile and phthalonitrile is used.

Thin films as used throughout this specification and claims are films so thin that they are not self-supporting in structure or so thin that they cannot be satisfactorily made by mechanical means such as cutting wafers from a piece of metal polyphthalocyanine. Normally the thicknesses of these thin films will be in the range of about 1 micron to 1000 microns, and preferably in the range of about 10 microns to 300 microns.

The thin films of metal polyphthalocyanine have the following structural formula:

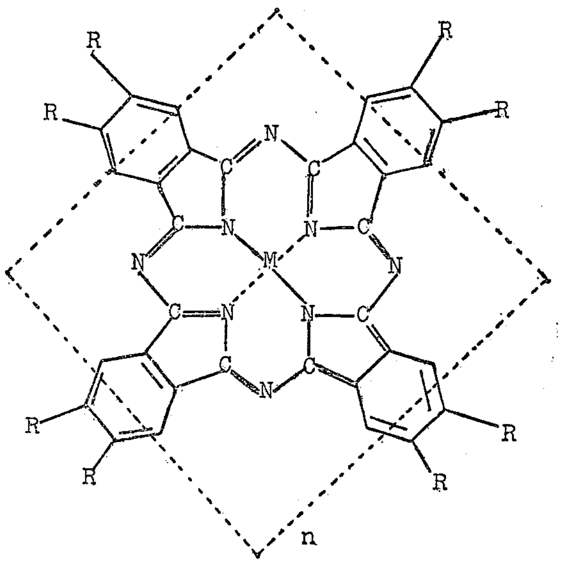

wherein the blocked-portion of the formula is the repeating structural phthalocyanine unit, $n$ is an integer of at least 2 and the R substituents are —H, nitrile groups —C≡N, or the linking groups =C—N—, —C—N=, and —C=N— the nitrile groups being present only as a pair in ortho-position one to the other on the six-carbon atom, unsaturated hydrocarbon ring; and the linking groups being present only as a pair in ortho-position one to the other on at least one of the six-carbon atom, unsaturated hydrocarbon rings and form a portion of an adjoining phthalocyanine unit wherein the 1,2,4,5-substituted, six-carbon atom, unsaturated hydrocarbon ring is mutually shared between the two phthalocyanine units; and that portion of any phthalocyanine unit not joined to at least one other phthalocyanine unit consists of the remainder of the six-carbon atom, unsaturated hydrocarbon ring, wherein such remainder is the structural group

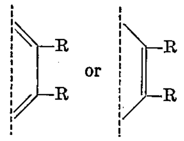

and the R substituents are —H or nitrile groups; and M is a metal atom. The M shown is particularly representative of copper; however, the metal atom whether copper or another metal atom can be shared by two or more polyphthalocyanine units instead of being attached only to one; and, some of the polyphthalocyanine units can be metal-free in which case the two N's of a unit shown bonded by solid line to the M will each be attached to hydrogen atoms instead of metal and the internal structure of this metal-free unit will then be similar to that shown in copending application Serial No. 696,027, filed November 13, 1957, page 2, III.

Metal phthalocyanines have been made from every group of the periodic table (K. Venkataraman, "The Chemistry of Synthetic Dyes," volume II, page 1126 (1952)), and there is no reason to believe that metal polyphthalocyanines cannot be made from all metals. Thus thin films of metal polyphthalocyanines can be formed from zinc, copper, iron, cobalt, nickel, palladium and platinum. Other suitable metals are manganese, chromium, molybdenum, vanadium, beryllium, magnesium, silver, mercury, aluminum, germanium, tin, lead, antimony, calcium, barium, cadmium, and other metals. Alternatively to reacting the metal directly with pyromellitonitrile or a mixture of pyromellitonitrile and phthalonitrile, the metal surface can first be reacted with, for example, HCl, chlorine or some other acid to form a metal salt on the surface which can be reacted with the nitrile instead of the metal per se. Suitable metal salts are named in copending application Serial No. 696,027, filed November 13, 1957, page 4, lines 13–22.

Metal-containing conductive surface as used in this specification and claims means a surface containing at least one metal component in sufficient quantity to form a continuous metal polyphthalocyanine film which is at least about 0.5% of the surface, and preferably the surface contains at least about 2.5% metal and of course 100% of the surface can be metal.

Instead of a single metal, metal alloys can be used and mixed metal polyphthalocyanine films will be formed. Also instead of a single metal, semiconductor compounds containing a metal made from groups III and V of the periodic table, groups II and VI compounds, groups I and VII compounds, and especially the semiconductor element germanium from group IV. These semiconductor materials can be either undoped or doped to give N-type or P-type compounds by methods which are well known in the art.

The substrates can be of any size and shape and it is conceivable that huge sheets or pieces of substrate having a very large surface area coated with a thin film of metal polyphthalocyanine will be useful in certain semiconductor applications especially where the article of the invention is to be used in conjunction with large amounts of electrical power. Normally in semiconductor devices, especially where the substrate is a metal or semiconductor, the dimensions of the substrate will be relatively small, e.g., 1 mm. thick, 10 mm. wide, and 15–20 mm. long. Obviously appreciably smaller or larger dimension of substrates may be desirable in some instances.

For inert substrates any type of glass can be used, various forms of carbon, especially graphite and diamond, natural or synthetic resins of most any type, such as phenol-formaldehyde, polyethylene, polystyrene, polyvinylchloride, polyacrylonitrile, nylon, synthetic or natural rubbers, wood, cement, etc. In other words any inert solid substance inorganic or organic can be used but it is preferred to use highly polished or even surfaced and nonporous substrates as has previously been stated, and an inert substrate must have a conductive surface thereon as previously defined.

The temperature of contacting the nitrile with the metal to form the thin film of metal polyphthalocyanine can vary widely with preferred temperatures varying according to the method of making the thin film of metal polyphthalocyanine. Also preferred temperatures will vary depending on the particular metal polyphthalocyanine being formed in a thin film. Methods of preparing copper phthalocyanine and other metal phthalocyanines are described in K. Venkataraman, referred to hereinabove, on pages 1126–1132, and these processes can be modified in view of the teachings of this application to be used for the preparation of thin films of metal polyphthalocyanines, with similar temperatures being used in the various processes. For example the nitrile can be brought into contact with a copper surface at about 225° C. or higher. In general, the lower the temperature of contacting of the nitrile with the metal or metal salt surface the longer the time will be required to completely react the materials, although obviously some reaction will take place immediately. In general temperatures in the range of about 125° C. to about 300° C., preferably in the range of about 140° C. to about 250° C. are used; and the time of contacting depending on the temperature may vary from a few minutes at very high temperatures to a number of hours or even days at lower temperatures in order to obtain a metal polyphthalocyanine film of desired thickness. Generally times from about 2 to about 18 hours are sufficient to provide a substantial yield and thickness of the desired thin film of metal polyphthalocyanine.

Any inert solvent for pyromellitonitrile or pyromellitonitrile and phthalonitrile is suitable, but high boiling solvents will usually be preferred so the reaction can be carried out at atmospheric pressure and higher temperatures. The solvent only serves the purpose of facilitating the intimate contacting of the nitrile and the metal or metal salt surface. The following solvents are illustrative of suitable solvents for use in the process of the invention, but this listing is not meant to be limiting of suitable solvents which can be used and other solvents will be obvious to those of ordinary skill in the art: 1,3,5-trichlorobenzene, t-butyl carbitol, ethylene glycol, trimethylene glycol, n-butylcarbitol, etc. If lower boiling solvents than those named above are used, normally it will be preferred to carry out the contacting of the nitrile with the metal or metal salt surface under pressure so higher temperatures can be used.

Although not necessary, it is desirable to have a hydrogen source present at the contacting of the nitrile with the metal or metal salt surface and examples of suitable hydrogen sources are the following: acetamide, triethanol amine, methyl glutamine, phenols, naphthols, aliphatic hydroxy compounds, urea, and the like. However, the pyromellitonitrile itself can supply the necessary hydrogen to prepare the thin film of metal polyphthalocyanine.

Especially when the reaction is carried out with the nitrile dissolved in a solvent, it is preferred to use a catalyst for the reaction, in which case the reaction proceeds faster and a lower temperatures for the formation of the thin film of metal polyphthalocyanine. Suitable catalysts for the reaction are, for example, ammonium chloride, stannous and stannic chlorides, antimony and aluminum trichlorides, cuprous chloride and the like, etc. As will be seen from the experimental examples, ammonium molybdate is also a good catalyst. Also arsenic pentoxide and ferric chloride are good catalysts. In general catalysts known to be useful for making metal phthalocyanines as described in the V. Kenkataraman, pages 1126–32, referred to hereinabove are suitable for the process of this invention. When a catalyst is used all that is required is a catalytic amount, i.e. less than 1% by weight based on the amount of nitrile of the catalyst will be quite adequate to promote the reaction, although more catalyst than 1% can in many instances be used without detriment to the metal polyphthalocyanine thin film. Normally it will be preferred to use just a trace of catalyst to minimize contamination of the metal polyphthalocyanine film.

The thin films of metal polyphthalocyanines can be treated by heating or doping to change the type and degree of the semiconductor properties of the film. Such methods of treatment are described in U.S. 3,009,976, column 7. For example, if the thin film of metal polyphthalocyanine is heated at a temperature in excess of about 350° C. and even to temperatures as high as 700°

C. for relatively short periods of time, decomposition and deterioration takes place wherein the properties of the film are altered. Preferred temperatures of heating are in the range of about 400° C. to about 500° C. If the metal phthalocyanine film is doped with bromine a P-type conductive film is formed. The other halogens as well as bromine used to treat metal polyphthalocyanines will also produce P-type conductivity material. Other types of doping materials to produce P-type films are oxygen, ozone, sulfur, selenium and tellurium. Also, metal phthalocyanines having a stoichiometric excess of the metal ion needed for producing the metal polyphthalocyanine will have P-type conductivity. Films of metal polyphthalocyanine having N-type conductivity can be produced by saturating the film with water vapor. Also, metal phthalocyanine films having a stoichiometric deficiency of metal necessary to produce the completely metalized polyphthalocyanine film will have N-type conductivity. Another type of treatment to produce N-type conductivity is treatment of the film with hydrogen sulfide.

The articles of the invention having the thin films of metal polyphthalocyanine are useful in various electronic devices in view of the semiconductive properties of the film, for example such devices as thermoelectric generators, point contact rectifiers, diodes, power amplifiers, transistors, solar cells, photo-responsive cells, radiation detectors, and other semiconductor devices.

FIGURE 1 is an elevational view of a cylindrical embodiment of the invention consisting of a copper cylinder having a thin film of copper polyphthalocyanine on one end thereof.

FIGURE 2 is an elevational view of a cylindrical embodiment of the invention consisting of a glass cylinder having a thin film of copper on one end and a thin film of copper polyphthalocyanine on the copper film.

EXAMPLE 1

Figure 1:
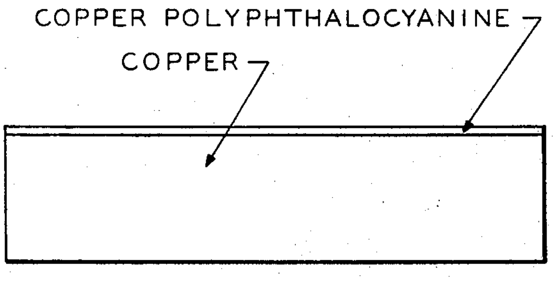
FIGURES 1 and 2 are elevational views of 2 embodiments of the invention.
Figure 2:
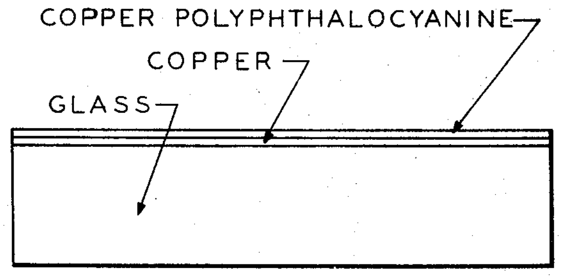

A 1 liter flask was filled one-half full with 1,3,5-trichlorobenzene (500 ml.) and fitted with a stirrer. To this flask was added 3–5 g. of pyromellitonitrile, 1 g. of urea, and a trace of ammonium molybdate. To the flask were then added ½" diameter copper pellets of ⅛" thickness, which pellets had been polished with a fine emery cloth and wiped clean before introduction to the flask. A number of experiments were carried out in which the pellets were heated at the boiling point of the solution for different lengths of time in the solution in the flask, and except for IV there were four pellets subjected to each different heating time. The heating times and the results of heating were as follows:

(I) ½ hour—Very thin purple coating hardly detectable.
(II) 2 hours—Thin purplish glint on pellet surface.
(III) 18 hours—Nice purple film.
(IV) 6 hours—Very thin purple film (1 piece).
(V) 24 hours—Purple film.

A pellet designated III above, which had a black blue appearance, was removed from the flask and washed with acetone. The pellet was then carefully worked over with Kleenex tissue to give a beautiful shiny purple surface.

EXAMPLE 2

Microscope slides were carefully cleaned, dried, and a coating of copper was evaporated on the slides under vacuum. The thickness of the copper films on the slides ranged all the way from those which were fairly transparent to those which were very difficult to see through. When first prepared the copper films could be rubbed off the slides rather readily. On standing overnight the films were a great deal more adherent.

Pieces of these slides having copper films thereon were placed in a solution of 3–5 grams of pyromellitonitrile, 1–2 grams of urea, and a pinch of ammonium molybdate in 150 ml. of 1,3,5-trichlorobenzene. These pieces of slides in the trichlorobenzene solution were heated at the boiling point of the trichlorobenzene for various lengths of time with slow stirring as follows:

(I) One group of slides was heated for four (4) hours. The copper polyphthalocyanine films appearing on these slides varied from iridescent purple to bluish green, depending on the thickness. The films adhered very well to the glass.

(II) A thin film of copper on the microscope slides was heated in the solution in a similar manner as in I but only for two (2) hours. The film didn't adhere to the glass very well and water easily removed this film.

(III) A thick film of copper on glass was heated for eight (8) hours in the solution described above. The glass plates were removed, washed with acetone and polished. These plates had films of such thickness of copper polyphthalocyanine that they were opaque.

EXAMPLE 3

Two ½" diameter by ⅛" thick copper pellets were freshly rubbed with fine emery cloth, rinsed with acetone and put into a three-necked flask with 250 ml. of t-butyl carbitol. One gram of pyromellitonitrile, one-half gram of urea, and a trace of ammonium molybdate was added to the flask. The flask was then heated at 220° C. for twenty-four hours with stirring. The copper pellets were removed from the flask, washed with acetone, and carefully polished with Kleenex tissues. The samples were covered with a very thin film of a desired copper polyphthalocyanine product. The films in this instance didn't appear to be as good films as were formed using the 1,3,5,-trichlorobenzene solvent. Treatment for only six hours in the t-butyl carbitol solvent gave a hardly visible amount of film.

Although the invention has been described in terms of specified embodiments which are set forth in considerable detail, it should be understood that this is by way of illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed is:

1. An as article of manufacture, a thin film, of 1 to 1000 microns of metal polyphthalocyanine on a metal-containing conductive surface of a substrate.

2. An article of claim 1 wherein said surface is a smooth surface.

3. An article of claim 1 wherein said metal is copper.

4. An article of claim 1 wherein said metal is copper and said substrate is copper having a smooth plane surface with said thin films of copper phthalocyanine thereon.

5. An article of claim 1 wherein said metal is copper, said substrate is glass having a thin smooth film of copper on a smooth plane surface of the glass, and said thin film of copper polyphthalocyanine is on said copper film.

6. A process for forming a thin film of 1 to 1000 microns of metal polyphthalocyanine on a metal-containing conductive surface of a substrate, comprising contacting a metal-containing surface of a substrate at elevated temperatures with a nitrile selected from the class consisting of pyromellitonitrile and a mixture of pyromellitonitrile and phthalonitrile having at least 50 mole percent pyromellitonitrile in the mixture for a time sufficient to form a film of desired thickness.

7. A process of claim 6 wherein said nitrile is pyromellitonitrile dissolved in an inert solvent.

8. A process of claim 6 wherein a catalyst for forming a metal phthalocyanine from phthalonitrile is present during contacting.

9. A process of claim 6 wherein a hydrogen source is present in minor amount based on said nitrile.

10. A process of claim 6 wherein said metal is copper.

11. A process of claim 6 wherein said nitrile is pyromellitonitrile dissolved in an inert solvent, ammonium molybdate is present in catalytic amount, and a minor amount based on said nitrile of urea is present.

References Cited by the Examiner

Doklady Akademiia Nauk SSSR vol. 132, No. 6, pp. 1299–1302, June 21, 1960.

ALFRED L. LEAVITT, *Primary Examiner.*

WILLIAM L. JARVIS, *Examiner.*